(12) United States Patent
Chen et al.

(10) Patent No.: US 9,172,343 B2
(45) Date of Patent: Oct. 27, 2015

(54) VOLUME ADJUSTMENT BASED ON USER-DEFINED CURVE

(71) Applicant: Apple Inc., Cupertino, CA (US)

(72) Inventors: David N. Chen, Cupertino, CA (US); Kelly B. Jacklin, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 260 days.

(21) Appl. No.: 13/960,587

(22) Filed: Aug. 6, 2013

(65) Prior Publication Data

US 2015/0043751 A1 Feb. 12, 2015

(51) Int. Cl.
*H03G 3/00* (2006.01)
*H03G 3/20* (2006.01)

(52) U.S. Cl.
CPC ........................................ *H03G 3/20* (2013.01)

(58) Field of Classification Search
CPC ........................................................ H03G 3/20
USPC ................................................. 381/104–107
See application file for complete search history.

(56) References Cited

U.S. PATENT DOCUMENTS

| 7,095,860 | B1 * | 8/2006 | Kemp ............................. 381/61 |
| 2012/0013552 | A1 | 1/2012 | Ahn |
| 2012/0057081 | A1 | 3/2012 | Petersson et al. |
| 2012/0062718 | A1 | 3/2012 | David |
| 2012/0230516 | A1 | 9/2012 | Wong et al. |
| 2014/0321670 | A1 * | 10/2014 | Nystrom et al. ............... 381/107 |
| 2014/0369527 | A1 * | 12/2014 | Baldwin ........................ 381/107 |
| 2015/0016633 | A1 * | 1/2015 | Gao et al. ...................... 381/107 |

* cited by examiner

*Primary Examiner* — Sonia Gay
(74) *Attorney, Agent, or Firm* — Fish & Richardson P.C.

(57) ABSTRACT

In some implementations, a user can specify an audio control curve for an audio track. The audio track can include an audio signal that is sampled at a specified rate. The audio control curve can be used to generate an audio control signal that can be sampled at the same rate as the audio signal. The audio signal and the audio control signal can be combined to produce sample-accurate adjustments of the audio signal. In some implementations, the audio control curve can correspond to gain adjustments for the audio signal. In some implementations, the audio control curve can be used to adjust the amplitude of the audio signal at particular frequencies. The audio control curve can be used to adjust treble or bass levels during the playback of an audio track, for example.

18 Claims, 6 Drawing Sheets

VOLUME ADJUSTMENT BASED ON USER-DEFINED CURVE

TECHNICAL FIELD

The disclosure generally relates to audio editing.

BACKGROUND

Audio editing software can allow a user to edit various characteristics of a digital audio track. For example, a user can apply equalizer filters to adjust the bass and treble of an audio signal. A user can provide input specifying volume and/or gain levels for different parts of an audio track.

SUMMARY

In some implementations, a user can specify an audio control curve for an audio track. The audio track can include an audio signal that is sampled at a specified rate. The audio control curve can be used to generate an audio control signal that can be sampled at the same rate as the audio signal. The audio signal and the audio control signal can be combined to produce sample-accurate adjustments of the audio signal. In some implementations, the audio control curve can correspond to gain adjustments for the audio signal. In some implementations, the audio control curve can be used to adjust the amplitude of the audio signal at particular frequencies. The audio control curve can be used to adjust treble or bass levels during the playback of an audio track, for example.

Particular implementations provide at least the following advantages: A user can easily specify adjustments to an audio signal by specifying an audio control curve. The audio control curve can be used by a computing device to produce sample-accurate adjustments of an audio signal.

Details of one or more implementations are set forth in the accompanying drawings and the description below. Other features, aspects, and potential advantages will be apparent from the description and drawings, and from the claims.

DESCRIPTION OF DRAWINGS

Like reference symbols in the various drawings indicate like elements.

DETAILED DESCRIPTION

Overview

This disclosure describes various Graphical User Interfaces (GUIs) for implementing various features, processes or workflows. These GUIs can be presented on a variety of electronic devices including but not limited to laptop computers, desktop computers, computer terminals, television systems, tablet computers, e-book readers and smart phones. One or more of these electronic devices can include a touch-sensitive surface. The touch-sensitive surface can process multiple simultaneous points of input, including processing data related to the pressure, degree or position of each point of input. Such processing can facilitate gestures with multiple fingers, including pinching and swiping.

When the disclosure refers to "select" or "selecting" user interface elements in a GUI, these terms are understood to include clicking or "hovering" with a mouse or other input device over a user interface element, or touching, tapping or gesturing with one or more fingers or stylus on a user interface element. User interface elements can be virtual buttons, menus, selectors, switches, sliders, scrubbers, knobs, thumbnails, links, icons, radio buttons, checkboxes and any other mechanism for receiving input from, or providing feedback to a user.

Figure 1:
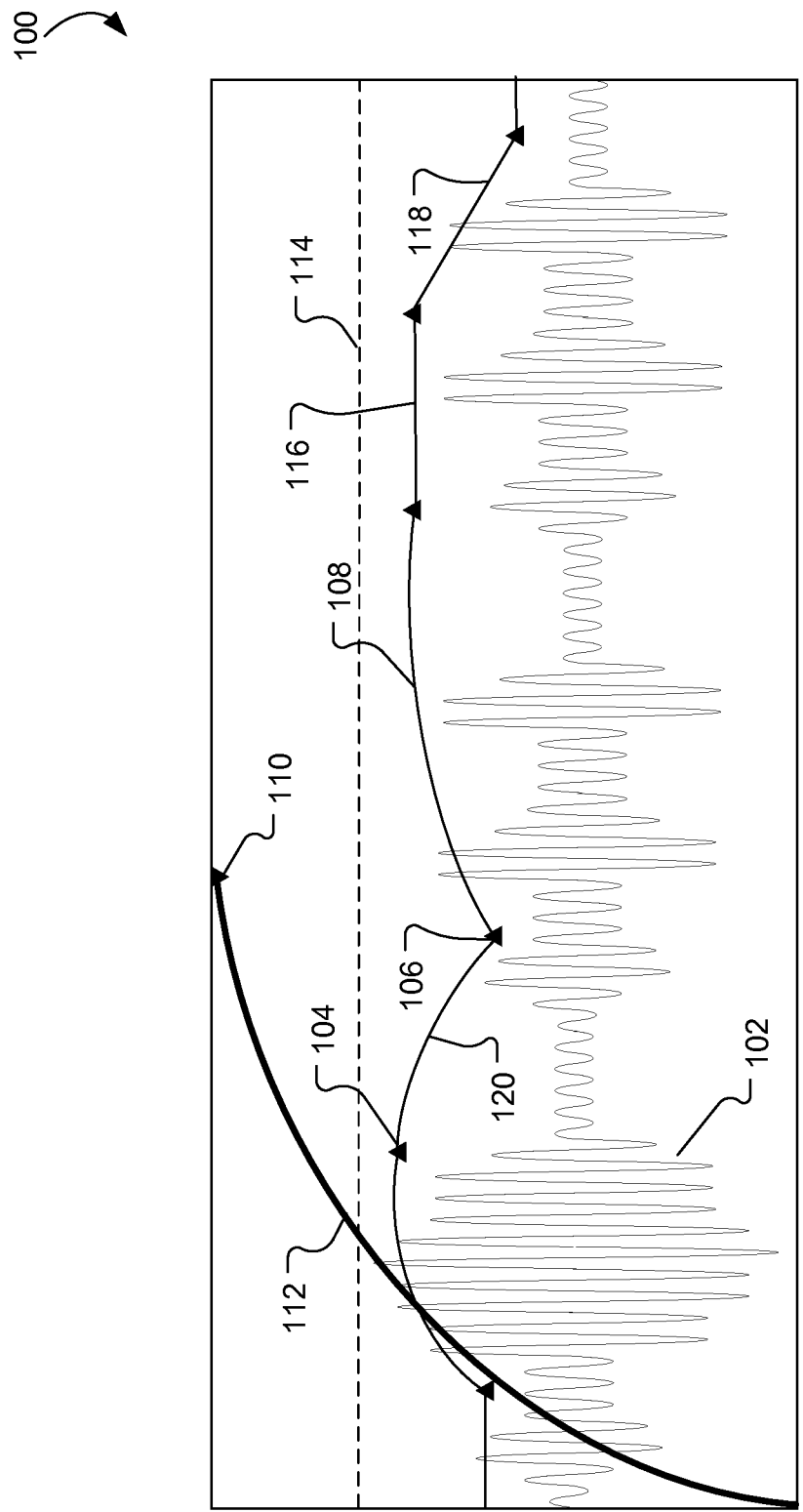
FIG. 1 illustrates an example graphical user interface for receiving user input specifying an audio control curve.

FIG. 1 illustrates an example graphical user interface 100 for receiving user input specifying an audio control curve. For example, GUI 100 can be part of a user interface for an audio and/or video editing application running on a computing device. GUI 100 can present a graphical representation of an audio signal 102 for an audio track on a display of the computing device. The audio track can be a stand-alone audio track that is being edited or adjusted by the user. The audio track can be an accompaniment to video or other media, for example.

In some implementations, a user can provide input to GUI 100 to specify one or more audio control curves. For example, a user can specify one or more control points (e.g., 104, 106) that can be used to specify an audio control curve 108. The user can select a location on GUI 100 to add an audio control point 104. The audio control point can correspond to a time and an adjustment value. The user can manipulate or move the audio control points (e.g., up, down, left, right) to change the adjustment value and location of an audio control point. For example, the user can select and drag audio control point 110 left or right to adjust where (e.g., a time location) in the audio signal 102 control point 110 is located. Moving where the audio control point 110 is located within audio signal 102 can cause an adjustment to audio control curve 112, for example.

In some implementations, the user can select and drag audio control point 106 up or down to change the adjustment value associated with the control point 106. For example, moving audio control point 106 upward can increase an adjustment value associated with audio control point 106. Moving audio control point 106 downward can decrease an adjustment value associated with audio control point 106. For example, if audio control curve 108 is a gain adjustment curve, then moving audio control point 106 upward will increase the gain associated with audio control point 106. Conversely, moving audio control point 106 downward will decrease the gain associated with audio control point 106.

In some implementations, GUI 100 can provide a reference indicator 114. For example, reference indicator 114 can indicate an adjustment reference value that provides the user with an idea of the value of audio control points. For example, reference indicator 114 can indicate a value of one (e.g., 1.0) unit (e.g., Decibel, percentage, fraction, etc.). The user can adjust the audio control points relative to the reference indicator. For example, if the user adjusts an audio control point above the reference indicator 114 associated with the value of one (1.0), then the user knows that the user is increasing the adjustment value (e.g., gain, filter, etc.) of the control point. If the user adjusts an audio control point below the reference indicator 114, then the user knows that the user is decreasing the adjustment value of the control point. For example, if the audio control curve 108 is a gain adjustment curve, then adjusting audio control point 104 above reference indicator 114 (e.g., above 1.0) results in an increase in gain associated with the location of audio control point 104 in the audio signal. Adjusting audio control point 104 below reference indicator 114 (e.g., below 1.0) results in a decrease in gain associated with the location of audio control point 104 in the audio signal.

In some implementations, the adjustment of the audio signal can be performed by multiplying the value of the control curve at a time location (t) by the value of the audio signal at the same time location (e.g., adjusted signal=gain$_t$×signal power). Thus, if the control curve indicates a gain value below 1.0, the power of the audio signal will be reduced. If the control curve indicates a gain value above 1.0, the power of the audio signal will be increased.

In some implementations, the user can specify the type of curve for connecting two audio control points. For example, audio control curve 108 includes control points 104 and 106. The audio editing application can automatically select a default curve for connecting control points 104 and 106. For example, the application can, by default, select a linear curve for connecting control points 104 and 106. In some implementations, the user can select a displayed curve to invoke a graphical user interface for selecting other curve shapes. For example, the audio editing application can be configured to generate an s-curve, hyperbolic curve, a linear curve, parabolic curve or any other type of curve for the gradual adjustment of an audio characteristic (e.g., gain, treble, bass, etc.) associated with the control curve. The selected type of curve can be displayed connecting two audio control points on GUI 100.

In some implementations, the audio control curve can be stored as metadata for the audio track. The audio control curve can include multiple segments having different curve shapes, as illustrated by GUI 100. Each segment can have a start time and an end time and a curve type. A flat curve segment (e.g., segment 116) can indicate a static adjustment value between the start and end times for the flat curve. The audio track metadata can include the start time, end time and static value (e.g., 0.5) to describe the flat curve segment.

A linear curve segment (e.g., 118) can be described in the metadata by the start and end points of the linear curve segment. The start point can include a start time and adjustment value (e.g., 00:00:02, 0.5). The end point can include an end time and adjustment value (e.g., 00:00:05, 0.7). The start point and the end point can be used to determine the slope between the start and the end point. The slope can be used to determine adjustment values along the line between the start time and the end time of the linear curve segment according to known methods (e.g., y=mx+b).

A non-linear curve segment (e.g., 120) can be described in the metadata by the start and end points of the non-linear curve segment and the curve type. The start point can include a start time and adjustment value (e.g., 00:00:02, 0.5). The end point can include an end time and adjustment value (e.g., 00:00:05, 0.7). The start point, the end point and the curve type can be used to determine adjustment values between the start and the end points. For example, well known interpolation and/or curve fitting techniques can be used to determine the adjustment values between the start and end points for the selected curve type.

In some implementations, the user can provide input to GUI 100 to cause the playback of an audio track. For example, the user can select a play button (not shown) to cause the audio editing application to play the audio track through speakers attached to the computing device. When playing back the audio track, the audio editing application can adjust the audio signal of the audio track according to the user defined audio control curves.

Figure 2:
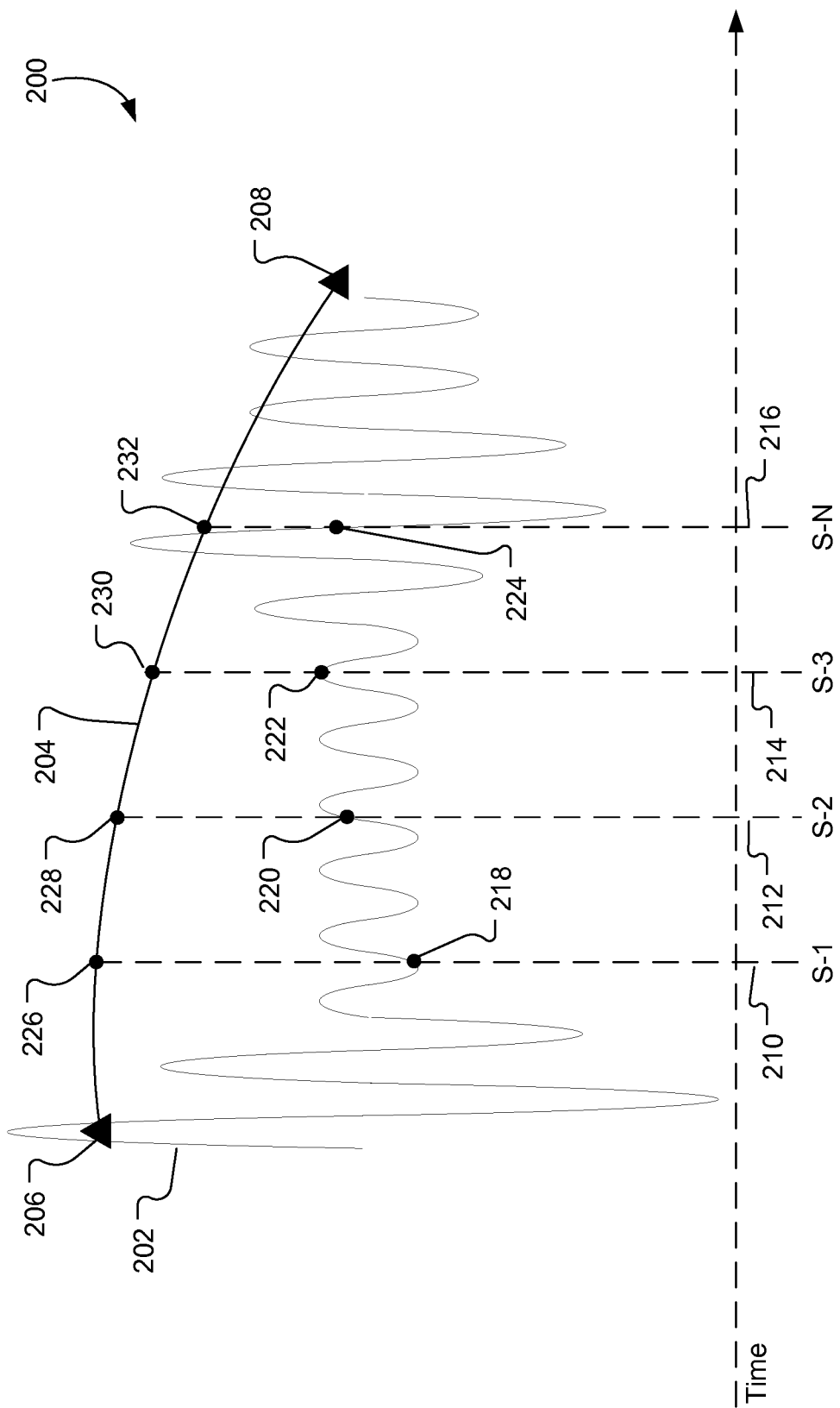
FIG. 2 is an example graph demonstrating adjusting an audio signal sample based on a corresponding control signal sample.

FIG. 2 is an example graph 200 demonstrating adjusting an audio signal sample based on a corresponding control signal sample. In some implementations, the audio editing application can generate sample accurate adjustments of audio signal 202 based on audio control curve 204. For example, audio control curve 204 is similar to an audio signal in that it provides audio signal adjustment values over time. The terms audio control curve and audio control signal are, therefore, used interchangeably herein.

In some implementations, a user can specify or define audio control curve 204 by providing input that generates audio control points 206 and 208. For example, audio control points 206 and 208 can be generated and manipulated as described above with reference to FIG. 1. In some implementations, a user can select or specify a type of curve to fit between audio control points 206 and 208. In some implementations, the audio control curve 204 can be associated with a segment of audio signal 202. For example, audio control point 206 can correspond to time $T_s$ of audio signal 202. Audio control point 208 can correspond to time $T_e$ of audio signal 202. Times $T_s$ and $T_e$ each can correspond to an elapsed time since or an amount of time (e.g., time index) from the beginning of audio signal 202 or the audio track that includes audio signal 202, for example. Thus, audio control curve 204 can be associated with the segment of audio signal 202 that begins at time $T_s$ and ends at time $T_e$.

In some implementations, audio signal 202 and audio control signal 204 can be sampled at the same rate. For example, if audio signal 202 is sampled at a rate of 44.1 kHz then audio control signal 204 will be sampled at 44.1 kHz. Other sampling rates can be used. For example, 48 kHz, 88.2 kHz or any other common digital audio sampling rate can be used to sample both the audio signal 202 and the audio control signal 204. However, both signals should be sampled at the same rate.

In some implementations, an audio signal sample and the control signal sample can be combined to generate an adjusted audio signal. For example, audio signal 202 can be sampled at times S-1 (210), S-2 (212), S-3 (214) through S-N (216) to generate audio signal sample values 218-224. Similarly, audio control signal 204 can be sampled at times S-1 (210), S-2 (212), S-3 (214) through S-N (216) to generate audio signal sample values 226-232. In some implementations, the audio signal sample values 218-224 can be multiplied by the respective audio control signal values 226-232 to generate an adjusted audio signal. For example, audio signal sample value 218 can be multiplied by audio control signal sample value 226 to generate an adjusted audio signal. Thus, if audio control signal 204 is a gain adjustment signal (curve), then multiplying audio signal sample value 218 by audio control signal sample value 226 will produce a gain adjusted audio signal sample where the gain of the audio signal sample has been adjusted according the audio control signal sample value 226. The other audio signal sample values 220-24 and audio control signal sample values 228-232 can be multiplied in the same way to produce an adjusted audio signal.

Figure 3:
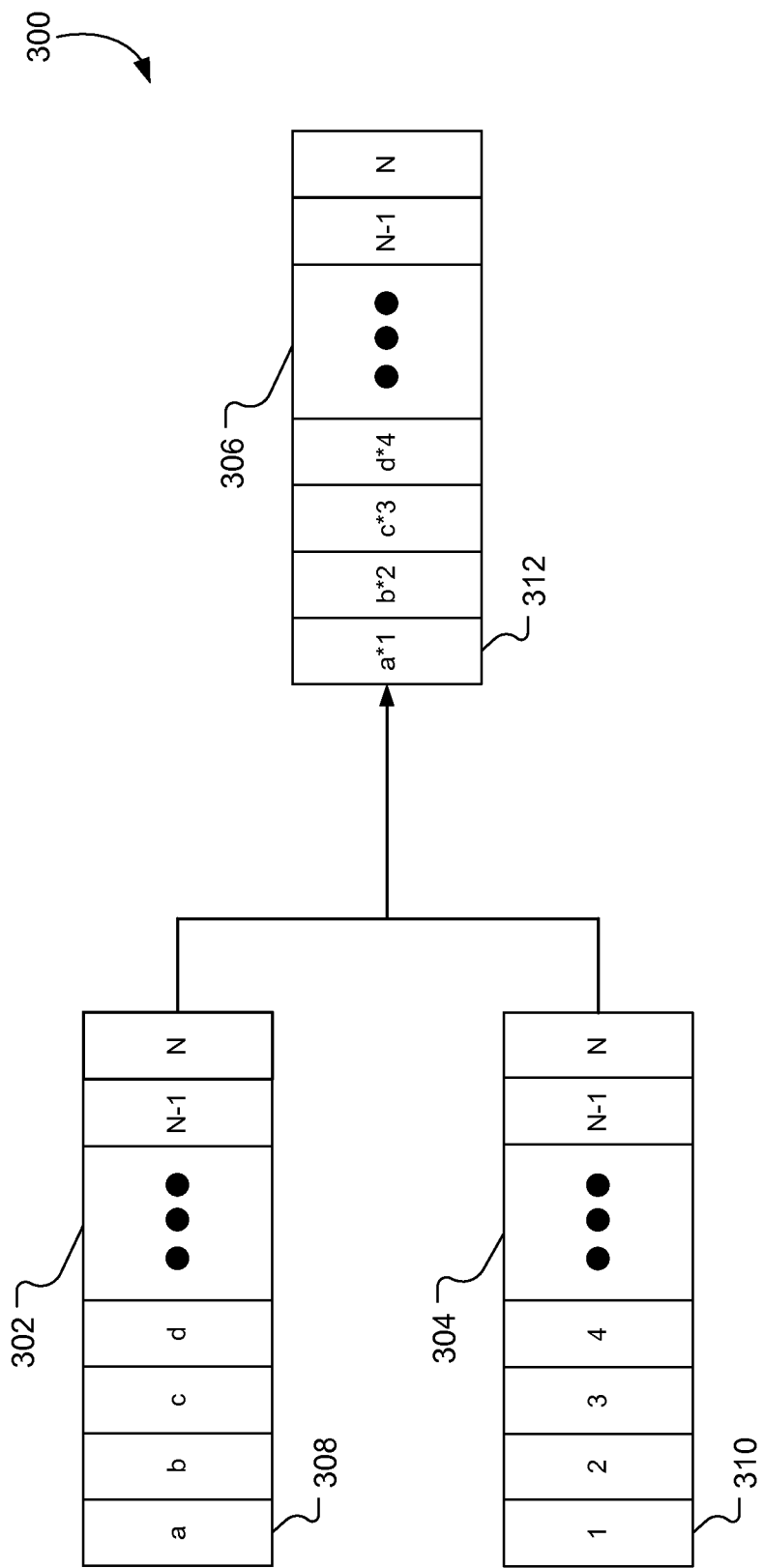
FIG. 3 illustrates example buffers used for sample-accurate adjustment of an audio signal based on an audio control signal.

FIG. 3 illustrates example buffers 300 that can be used for sample-accurate adjustment of an audio signal based on an audio control signal. For example, buffer 302 can store audio signal samples (e.g., audio signal samples 218-224 of FIG. 2). Buffer 304 can store audio control signal samples (e.g., audio control signal samples 226-232 of FIG. 2), for example. In some implementations, the audio editing application can read corresponding entries in buffers 302 and 304 and combine the entries to generate an adjusted audio signal buffer 306. For example, the audio editing application can populate buffer 302 with audio signal samples corresponding to an audio track. Audio editing application can populate buffer 304 with audio control signal samples corresponding to a user-defined audio control curve.

In some implementations, the audio editing application can generate an adjusted audio signal buffer 306 by multiplying entry 308 from the audio signal buffer 302 by entry 310 from the audio control signal buffer 304 to generate adjusted audio sample 312 in adjusted audio signal buffer 312. For example, the audio editing application can perform the multiplication for each entry in buffers 302 and 304 until the entire audio signal sample buffer 302 has been adjusted according to the audio control signal samples of buffer 304.

In some implementations, once adjusted audio signal buffer 306 has been generated, the adjusted audio signal samples in audio signal buffer 306 can be played for the user. For example, adjusted audio signal buffer 306 can include a portion of an audio signal or audio track. The portion of the audio signal represented by the samples in buffer 306 can be played back for the user through speakers attached to a computing device.

In some implementations, once buffer 302 has been adjusted based on buffer 304 to generate buffer 306, buffers 302 and 304 can be populated with the new samples associated with unplayed portions of the audio signal. For example, buffers 302 and 304 can include a number (e.g., 512) of samples. However, the audio signal can include thousands or millions of samples. Thus, once the 512 samples in buffers 302 and 304 have been processed. Buffers 302 and 304 can be populated with the next 512 samples from the audio signal and control signal so that the next portion of the audio signal can be adjusted and played back to the user.

In some implementations, the audio editing application can adjust an audio signal using multiple audio control curves. For example, audio signal 102 of FIG. 1 can be adjusted using audio control curve 108 and audio control curve 112. When there is more than one audio control curve, each audio control curve can be serially applied to the audio signal. For example, audio signal 102 can be adjusted using audio control curve 108 first to produce an adjusted audio signal. Then, the adjusted audio signal can be adjusted using audio control curve 112. Thus, the adjusted samples in buffer 306 can be multiplied with audio control curve samples in another audio control curve buffer 304 to generate another adjusted audio sample buffer 306. In some implementations, if the audio editing application determines that the signal adjustments result in a zero value for an audio sample, then additional control curves will not be applied to or multiplied with the sample.

In some implementations, the audio control curve can include a flat horizontal line segment indicating static audio adjustment value. For example, every sample of the audio control curve can produce the same value (e.g., 0.7). In some implementations, if the audio control curve corresponds to a static value, the audio editing application will not allocate buffer 304. Instead, the audio editing application can multiply each entry in audio signal buffer 302 by the static value in real time (e.g., as each audio signal sample is about to be output) to generate the adjusted audio signal. Thus, the audio editing application can conserve memory resources by allocating only enough memory to store the single static value instead of allocating audio control signal sample buffer 304.

Figure 4:
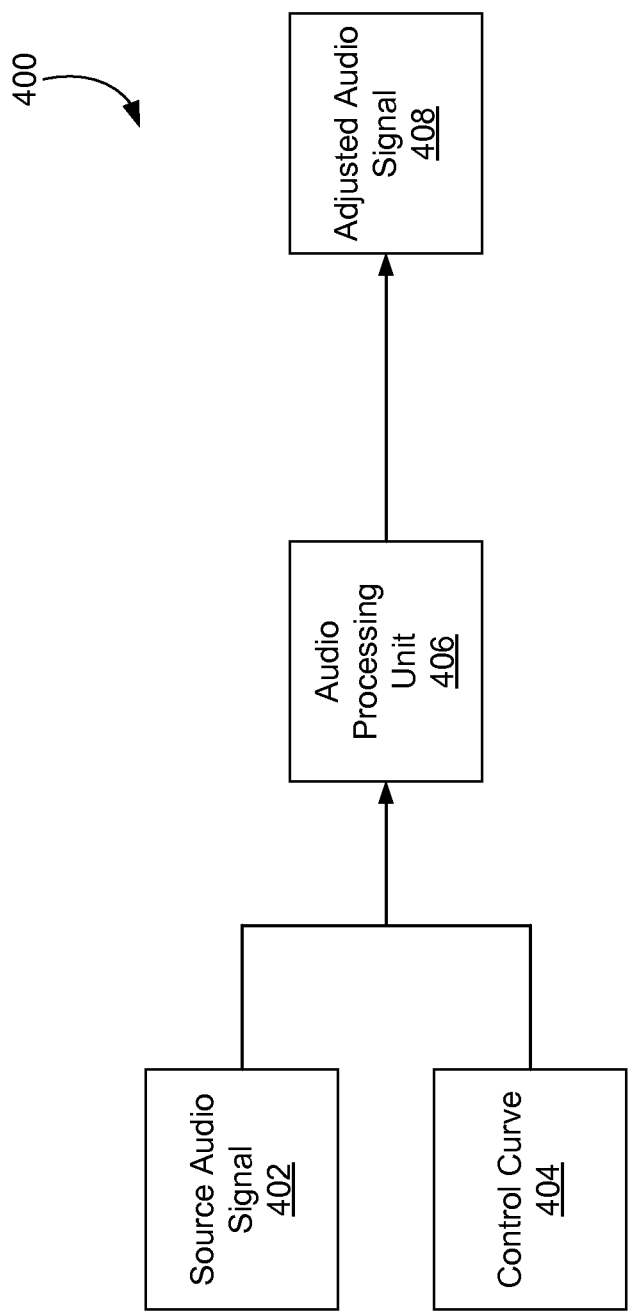
FIG. 4 illustrates an example system for processing an audio signal using an audio control curve.

FIG. 4 illustrates an example system 400 for processing an audio signal using an audio control curve. For example, during playback of an audio track, system 400 can adjust an audio signal based on a user defined control signal and present the adjusted audio signal to the user. For example, the adjusted audio signal can be presented to the user by playing the adjusted audio signal through speakers attached to a computing device.

In some implementations, system 400 can include a source audio signal 402. For example, source audio signal 402 can be an audio signal associated with an audio track (e.g., music, speech, etc.) being edited in an audio and/or video editing application. In some implementations, system 400 can include an audio control curve 404. For example, audio control curve 404 can be a user defined curve or collection (e.g., series) of curves used to adjust source audio signal 402 over time, as described above. Audio control curve 404 can be described in metadata for source audio signal 402, as described above with reference to FIG. 1. For example, audio control curve 404 can include metadata describing audio control curve segments (e.g., start points, end points, curve types, etc.).

In some implementations, system 400 can include an audio processing unit 406. For example, audio processing unit 406 can be a component of the audio editing application described above. In some implementations, audio processing unit 406 can be configured to obtain source audio signal 402 and control curve 404 and adjust source audio signal 402 according to the characteristics of control curve 404. For example, audio processing unit 406 can retrieve the audio source signal metadata describing control curve 404 and generate adjustment values based on the start points, end points and curve type described in the metadata. The audio processing unit 406 can use well known curve fitting and/or interpolation methods to generate adjustment values based on the start points, end points and curve types described in the metadata.

In some implementations, the control curve can be sampled (e.g., adjustment values can be generated) at the same rate as source audio signal 402. For example, for a segment of the control curve 404 that is one second long and if the source audio signal 402 is sampled at 48 kHz, then 48,000 control values will be generated based on the control curve (e.g., one control value every 1/48,000 of a second from the start time to the end time of the control curve segment). In some implementations, the audio processing unit can place the control curve samples into a control curve sample buffer. Once the control curve buffer is generated, each control curve sample value in the buffer can be multiplied by a corresponding (e.g., time corresponding) audio source signal sample value in an audio signal sample buffer to generate adjusted audio signal 408. For example, adjusted audio signal 408 can be stored in buffer 306 of FIG. 3.

In some implementations, audio processing unit 406 can generate the values for the control curve sample buffer in real time (e.g., as the control curve buffer is needed for playback). In some implementations, audio processing unit 406 can generate the values for the control curve sample buffer in advance of playback. For example, audio processing unit 406 can be configured to generate the control curve sample buffer a couple of seconds in advance of when the control curve sample buffer is needed. If the current playback position of the audio signal is at time 'T', then the control curve sample buffer can be generated for time 'T+2 seconds', for example.

In some implementations, audio processing unit 406 can adjust source audio signal 402 based on more than one control curve 404. For example, FIG. 1 illustrates a user-defined audio control curve 108 and a user-defined audio control curve 112. Audio processing unit 406 can adjust the source audio signal 402 based on audio control curve 108 to generate adjusted audio signal 408. Adjusted audio signal 408 can then be treated as source audio signal 402 and audio processing unit 406 can adjust adjusted audio signal 408 based on audio control curve 112. Thus, a source audio signal can be adjusted using multiple audio control curves by serially applying the audio control curves to the audio signal.

In some implementations, audio processing unit 406 can determine when control curve 404 has changed and regenerate the control curve sample values. For example, a user can manipulate the control points of FIG. 1 to change control curve 404 while the audio and/or video editing applications is playing back an audio track. Audio processing unit 406 can determine that the control curve has changed in real time, purge the control curve buffer and generate a new control curve buffer with control values that represent the changed control curve. The audio processing unit 406 can then generate and play back adjusted audio signal 408 using control curve sample values from the new control curve buffer. For example, the adjustments to the audio signal based on a changed control curve can be made without stopping playback of the adjusted audio signal.

Example Process

Figure 5:
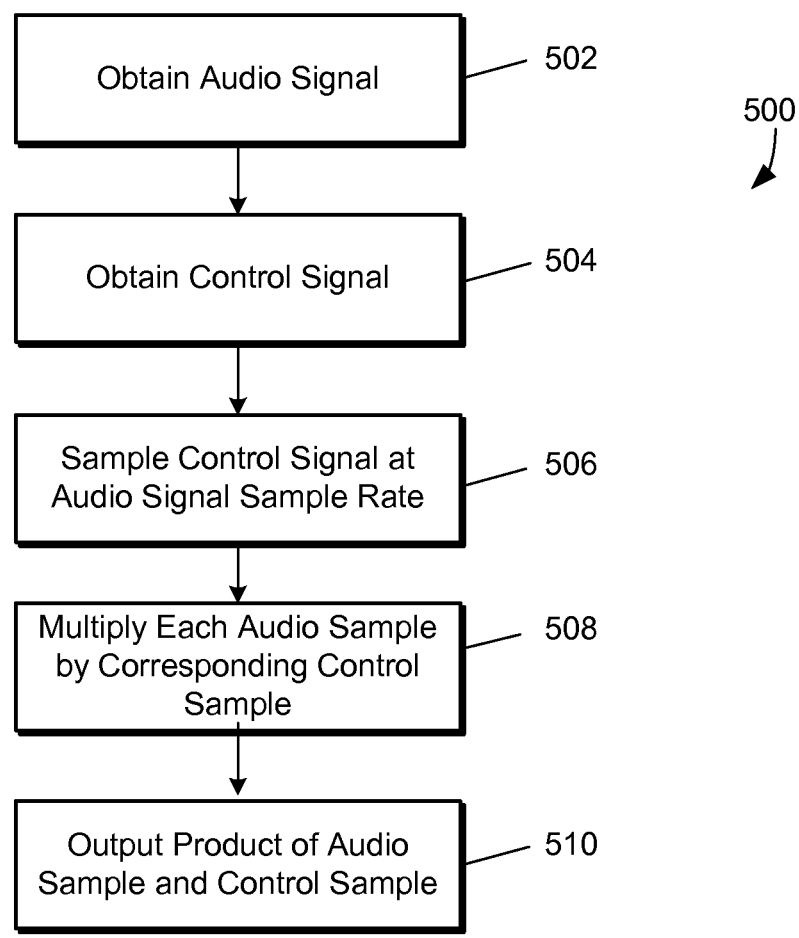
FIG. 5 is flow diagram of an example process for volume adjustment based on a user defined curve.

FIG. 5 is flow diagram of an example process 500 for volume adjustment based on a user defined curve. For example, process 500 can be performed by an audio and/or video editing application or audio processing unit 406 of FIG. 4. At step 502, an audio signal can be obtained by an audio editing application executing on a computing device. For example, the audio editing application can obtain an audio signal from an audio track in a media file stored on a computing device. A user can select and open the media file using the audio editing application and view a visual representation of the audio track, as illustrated by FIG. 1.

At step 504, a control signal can be obtained by the audio editing application executing on the computing device. For example, a user can provide input to the user interface of FIG. 1 to create and manipulate control points for generating a control curve. The user-defined control curve can be used to generate a control signal (e.g., a sequence of control values over time). For example, the control curve can be made up of segments having different start and end points (e.g., time, adjustment value pairs) and curve types (flat, linear, non-linear curves). The audio editing application can use the start points, end points and curve type to interpolate points between the start points and end points to generate sample values for the control signal.

At step 506, the control signal can be sampled at the audio signal sample rate. For example, the audio signal can be a digital audio signal that has a sampling rate of 44.1 kHz, 48 kHz, or some other well-known digital audio sampling rate. To facilitate sample accurate audio signal adjustments, the control signal should be sampled at the same rate as the audio signal so that each audio signal sample value has a corresponding control signal sample value.

At step 508, each audio signal sample can be multiplied by a corresponding control signal sample to generate an adjusted audio signal sample. For example, the audio editing application can generate an audio signal buffer that stores 512 audio signal samples. The audio editing application can generate a control signal buffer that stores 512 control signal samples that correspond in time to respective audio signal samples in the audio signal buffer. Each sample in the audio signal buffer can be multiplied by a corresponding sample in the control sample buffer to generate an adjusted audio signal buffer.

At step 510, the audio editing application can output the product of the audio samples and control samples. For example, the adjusted audio signal buffer can be presented to the user by playing the adjusted audio signal in the audio signal buffer through speakers attached to the computing device.

In some implementations, the audio control curve described herein can be associated with gain or volume adjustments to be applied to an audio signal. However, the audio control curve can be associated with other adjustments to an audio signal. For example, the audio control curve can be used to adjust various filters (e.g., treble filters, bass filters, etc.) that are to be applied to the audio signal.

Example System Architecture

Figure 6:
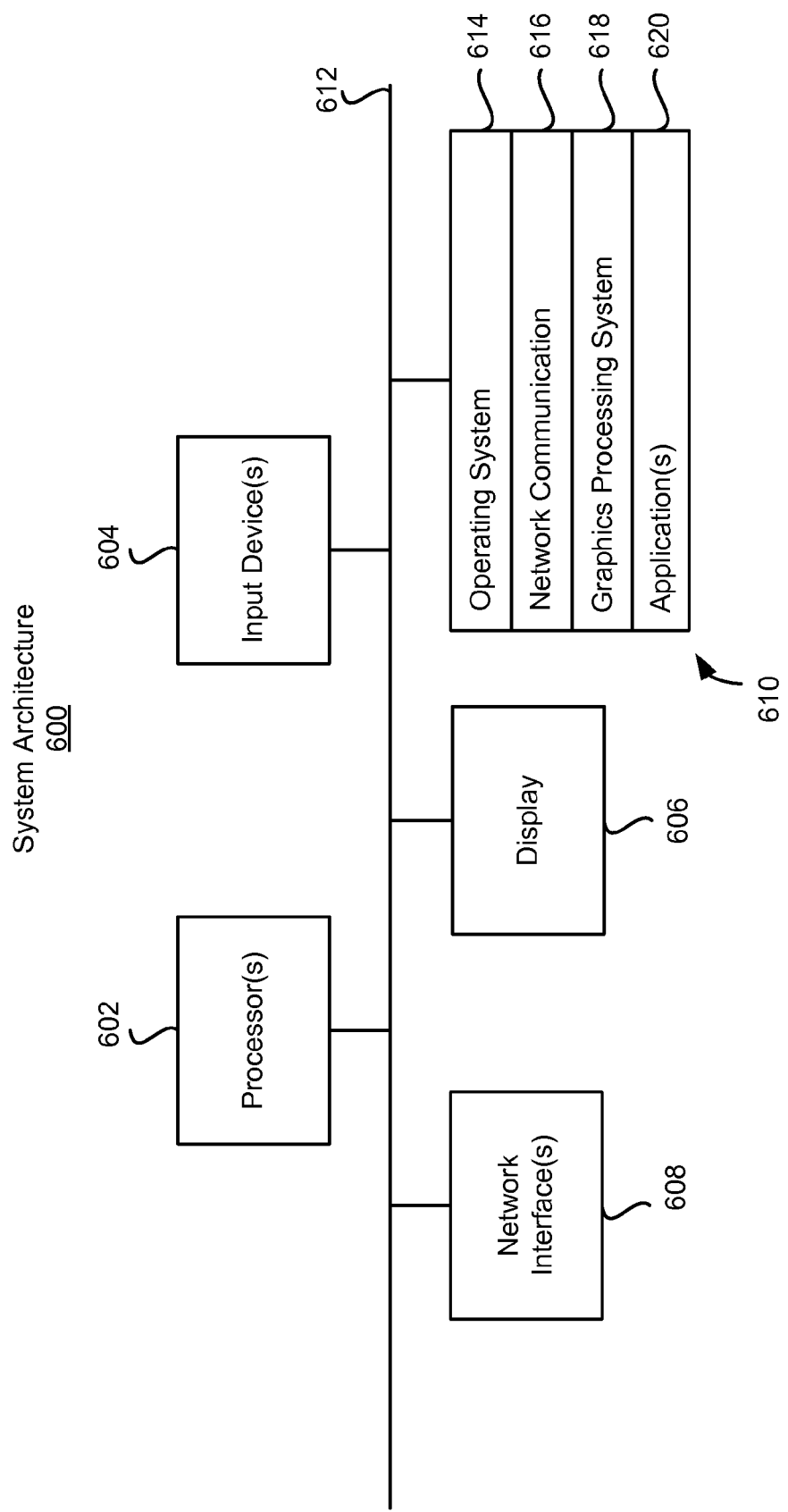
FIG. 6 is a block diagram of an example system architecture implementing the features and processes of FIGS. 1-5.

FIG. 6 is a block diagram of an example system architecture 600 implementing the features and processes of FIGS. 1-5. The architecture 600 can be implemented on any electronic device that runs software applications derived from compiled instructions, including without limitation personal computers, servers, smart phones, media players, electronic tablets, game consoles, email devices, etc. In some implementations, the architecture 600 can include one or more processors 602, one or more input devices 604, one or more display devices 606, one or more network interfaces 608 and one or more computer-readable mediums 610. Each of these components can be coupled by bus 612.

Display device 606 can be any known display technology, including but not limited to display devices using Liquid Crystal Display (LCD) or Light Emitting Diode (LED) technology. Processor(s) 602 can use any known processor technology, including but not limited to graphics processors and multi-core processors. Input device 604 can be any known input device technology, including but not limited to a keyboard (including a virtual keyboard), mouse, track ball, and touch-sensitive pad or display. Bus 612 can be any known internal or external bus technology, including but not limited to ISA, EISA, PCI, PCI Express, NuBus, USB, Serial ATA or FireWire. Computer-readable medium 610 can be any medium that participates in providing instructions to processor(s) 602 for execution, including without limitation, non-volatile storage media (e.g., optical disks, magnetic disks, flash drives, etc.) or volatile media (e.g., SDRAM, ROM, etc.).

Computer-readable medium 610 can include various instructions 614 for implementing an operating system (e.g., Mac OS®, Windows®, Linux). The operating system can be multi-user, multiprocessing, multitasking, multithreading, real-time and the like. The operating system performs basic tasks, including but not limited to: recognizing input from input device 604; sending output to display device 606; keeping track of files and directories on computer-readable medium 610; controlling peripheral devices (e.g., disk drives, printers, etc.) which can be controlled directly or through an I/O controller; and managing traffic on bus 612. Network communications instructions 616 can establish and maintain network connections (e.g., software for implementing communication protocols, such as TCP/IP, HTTP, Ethernet, etc.).

A graphics processing system 618 can include instructions that provide graphics and image processing capabilities. For example, the graphics processing system 618 can implement the processes described with reference to FIG. 1.

Application(s) 620 can be an application that uses or implements the processes described in reference to FIGS. 1-5. For example, application(s) 620 can include an audio and/or video editing application that uses or implements the processes or functions described with reference to FIGS. 1-5. The processes described with reference to FIGS. 1-5 can also be implemented, in whole or in part, in operating system 614.

The described features can be implemented advantageously in one or more computer programs that are executable on a programmable system including at least one programmable processor coupled to receive data and instructions from, and to transmit data and instructions to, a data storage system, at least one input device, and at least one output device. A computer program is a set of instructions that can be used, directly or indirectly, in a computer to perform a certain activity or bring about a certain result. A computer program can be written in any form of programming language (e.g., Objective-C, Java), including compiled or interpreted languages, and it can be deployed in any form, including as a stand-alone program or as a module, component, subroutine, or other unit suitable for use in a computing environment.

Suitable processors for the execution of a program of instructions include, by way of example, both general and special purpose microprocessors, and the sole processor or one of multiple processors or cores, of any kind of computer. Generally, a processor will receive instructions and data from a read-only memory or a random access memory or both. The essential elements of a computer are a processor for executing instructions and one or more memories for storing instructions and data. Generally, a computer will also include, or be operatively coupled to communicate with, one or more mass storage devices for storing data files; such devices include magnetic disks, such as internal hard disks and removable disks; magneto-optical disks; and optical disks. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and CD-ROM and DVD-ROM disks. The processor and the memory can be supplemented by, or incorporated in, ASICs (application-specific integrated circuits).

To provide for interaction with a user, the features can be implemented on a computer having a display device such as a CRT (cathode ray tube) or LCD (liquid crystal display) monitor for displaying information to the user and a keyboard and a pointing device such as a mouse or a trackball by which the user can provide input to the computer.

The features can be implemented in a computer system that includes a back-end component, such as a data server, or that includes a middleware component, such as an application server or an Internet server, or that includes a front-end component, such as a client computer having a graphical user interface or an Internet browser, or any combination of them. The components of the system can be connected by any form or medium of digital data communication such as a communication network. Examples of communication networks include, e.g., a LAN, a WAN, and the computers and networks forming the Internet.

The computer system can include clients and servers. A client and server are generally remote from each other and typically interact through a network. The relationship of client and server arises by virtue of computer programs running on the respective computers and having a client-server relationship to each other.

One or more features or steps of the disclosed embodiments can be implemented using an API. An API can define on or more parameters that are passed between a calling application and other software code (e.g., an operating system, library routine, function) that provides a service, that provides data, or that performs an operation or a computation.

The API can be implemented as one or more calls in program code that send or receive one or more parameters through a parameter list or other structure based on a call convention defined in an API specification document. A parameter can be a constant, a key, a data structure, an object, an object class, a variable, a data type, a pointer, an array, a list, or another call. API calls and parameters can be implemented in any programming language. The programming language can define the vocabulary and calling convention that a programmer will employ to access functions supporting the API.

In some implementations, an API call can report to an application the capabilities of a device running the application, such as input capability, output capability, processing capability, power capability, communications capability, etc.

A number of implementations have been described. Nevertheless, it will be understood that various modifications may be made. For example, other steps may be provided, or steps may be eliminated, from the described flows, and other components may be added to, or removed from, the described systems. Accordingly, other implementations are within the scope of the following claims.

What is claimed is:

1. A method comprising:
   obtaining, by a computing device, an audio signal, where the audio signal includes a plurality of audio signal samples that were sampled at a sampling rate;
   obtaining, by the computing device, a control signal associated with the audio signal;
   sampling, by the computing device, the control signal at the sampling rate to generate a plurality of control signal samples; and
   adjusting, by the computing device, each of the audio signal samples based on a corresponding control signal sample from the plurality of control signal samples to generate an adjusted audio signal.

2. The method of claim 1, further comprising:
   generating the control signal based on a user defined control curve.

3. The method of claim 2, further comprising:
   determining that a user has modified the control curve during playback of the adjusted audio signal;
   generating a modified control signal based on the modified control curve; and
   while continuing playback, adjusting the audio signal based on the modified control curve.

4. The method of claim 2, further comprising:
   presenting a graphical user interface that displays a representation of the audio signal;
   receiving user input to the graphical user interface indicating a start point, an end point and a curve type; and
   generating the control curve based on the user input.

5. The method of claim 1, wherein the adjusting comprises multiplying a first value associated with a control curve sample by a second value associated with an audio signal sample.

6. The method of claim 1, wherein each of the audio signal samples and the control signal samples correspond according to time.

7. A non-transitory computer-readable medium including instructions which, when executed by one or more processors, causes:
   obtaining, by a computing device, an audio signal, where the audio signal includes a plurality of audio signal samples that were sampled at a sampling rate;

obtaining, by the computing device, a control signal associated with the audio signal;

sampling, by the computing device, the control signal at the sampling rate to generate a plurality of control signal samples; and adjusting, by the computing device, each of the audio signal samples based on a corresponding control signal sample from the plurality of control signal samples to generate an adjusted audio signal.

8. The non-transitory computer-readable medium of claim 7, wherein the instructions cause:

generating the control signal based on a user defined control curve.

9. The non-transitory computer-readable medium of claim 8, wherein the instructions cause:

determining that a user has modified the control curve during playback of the adjusted audio signal;

generating a modified control signal based on the modified control curve; and while continuing playback, adjusting the audio signal based on the modified control curve.

10. The non-transitory computer-readable medium of claim 8, wherein the instructions cause:

presenting a graphical user interface that displays a representation of the audio signal;

receiving user input to the graphical user interface indicating a start point, an end point and a curve type; and generating the control curve based on the user input.

11. The non-transitory computer-readable medium of claim 7, wherein the instructions that cause adjusting comprise instructions that cause multiplying a first value associated with a control curve sample by a second value associated with an audio signal sample.

12. The non-transitory computer-readable medium of claim 7, wherein each of the audio signal samples and the control signal samples correspond according to time.

13. A system comprising:

one or more processors; and a non-transitory computer-readable medium including instructions which, when executed by one or more processors, causes:

obtaining, by a computing device, an audio signal, where the audio signal includes a plurality of audio signal samples that were sampled at a sampling rate;

obtaining, by the computing device, a control signal associated with the audio signal;

sampling, by the computing device, the control signal at the sampling rate to generate a plurality of control signal samples; and adjusting, by the computing device, each of the audio signal samples based on a corresponding control signal sample from the plurality of control signal samples to generate an adjusted audio signal.

14. The system of claim 13, wherein the instructions cause:

generating the control signal based on a user defined control curve.

15. The system of claim 14, wherein the instructions cause:

determining that a user has modified the control curve during playback of the adjusted audio signal;

generating a modified control signal based on the modified control curve; and while continuing playback, adjusting the audio signal based on the modified control curve.

16. The system of claim 14, wherein the instructions cause:

presenting a graphical user interface that displays a representation of the audio signal;

receiving user input to the graphical user interface indicating a start point, an end point and a curve type; and generating the control curve based on the user input.

17. The system of claim 13, wherein the instructions that cause adjusting comprise instructions that cause multiplying a first value associated with a control curve sample by a second value associated with an audio signal sample.

18. The system of claim 13, wherein each of the audio signal samples and the control signal samples correspond according to time.

* * * * *